Figure 1:
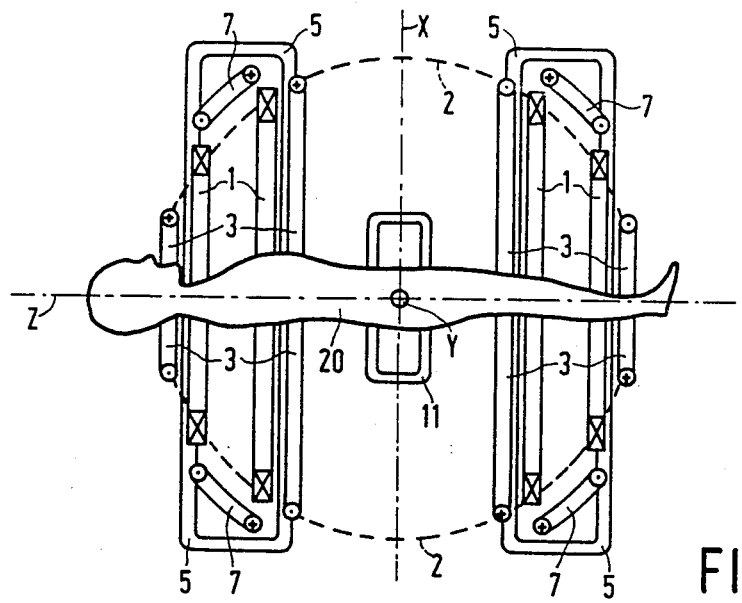

United States Patent [19]

McKinnon

[11] Patent Number: 4,814,710

[45] Date of Patent: Mar. 21, 1989

[54] METHOD OF DETERMINING THE SPECTRAL DISTRIBUTION OF THE NUCLEAR MAGNETIZATION IN A LIMITED VOLUME RANGE

[75] Inventor: Graeme C. McKinnon, Ellerau, Fed. Rep. of Germany

[73] Assignee: U.S. Philips Corporation, New York, N.Y.

[21] Appl. No.: 20,068

[22] Filed: Feb. 27, 1987

[30] Foreign Application Priority Data

Mar. 6, 1986 [DE] Fed. Rep. of Germany ....... 3607341
May 17, 1986 [DE] Fed. Rep. of Germany ....... 3616749

[51] Int. Cl.$^4$ ........................................... G01R 33/20
[52] U.S. Cl. ................................... 324/309; 324/307
[58] Field of Search ............... 324/307, 309, 312, 310; 128/653

[56] References Cited

U.S. PATENT DOCUMENTS 4,583,044 4/1986 Case et al. ........................... 324/309
4,709,212 11/1987 MacFall et al. ...................... 324/309

OTHER PUBLICATIONS

"Stimulated Echo Imaging", J. Frahm et al. Journal of Magnetic Resonance, vol. 64, pp. 81–93 Academic Press (1985).

Primary Examiner—Stewart J. Levy
Assistant Examiner—Louis M. Arana

[57] ABSTRACT

In order to avoid the disturbing influence of the decay of the transverse magnetization and/or of the eddy currents, a sequence comprising at least two high-frequency pulses is repeated n times, the distance being varied from sequence to sequence so that the position in time of the echo signals produced by the high-frequency pulses varies from sequence to sequence. If each time a sample value from each echo signal is used for the Fourier transformation which has a defined position with respect to the respective sequence, a frequency spectrum is obtained which does not depend or depends only to a smaller extent upon the said disturbing influences.

10 Claims, 3 Drawing Sheets

METHOD OF DETERMINING THE SPECTRAL DISTRIBUTION OF THE NUCLEAR MAGNETIZATION IN A LIMITED VOLUME RANGE

The invention relates to a method of determining the spectral distribution of the nuclear magnetization in a limited volume range, at least one sequence comprising at least two high-frequency pulses acting upon a range of examination in the presence of a stationary homogeneous magnetic field and the echo signals produced in the volume range being converted into digital sample values, after which a Fourier transformation is carried out.

Such a method, which is particularly suitable for medical diagnostics, is known from J. Magn. Reson. 56 (1984), pp. 350 to 354. The sample values occurring during the sampling of an individual echo signal are then subjected to a Fourier transformation, from which the frequency spectrum or the spectral distribution of the nuclear magnetization in the volume range is obtained.

It has been found that the lines of such a spectrum are widened by different influences. One of these disturbing influences is the decay of the transverse magnetization in the excited volume range; the higher the speed at which the transverse magnetization decays—that is to say the shorter the resonance relaxation time T2—, the greater is the extent to which the lines are widened. In practice an even stronger influence can be exerted on the widening of the lines by the magnetic fields varying with time, which are produced by the eddy currents occurring when magnetic gradient fields are switched. The present invention has for its object to carry out a method of the kind mentioned in the opening paragraph in such a manner that also in the presence of the aforementioned disturbing influences the spectral distribution of the nuclear magnetization in the limited volume range can be determined.

According to the invention, this object is achieved in that each sequence is repeated several times, the position in time of at least one high-frequency pulse being varied from sequence to sequence so that the position in time of the echo signal within the sequence is shifted from sequence to sequence and that from each of these sequences a sample value, which has a given position in time within the sequence, is used for the Fourier transformation.

According to the invention, therefore not the sample values of a single echo signal, but the sample values derived from the echo signals relatively offset in time are subjected to a Fourier transformation, these sample values having each time within their sequence the same position in time. In fact it can be shown that the frequency spectrum obtained by the Fourier transformation corresponds to the frequency spectrum which would be obtained if the disturbing influence should not be present, the individual spectral values being multiplied by a factor, which depends inter alia upon the time for which the each time active disturbing influence in the relevant sequence has acted upon the nuclear magnetization. These disturbing influences on the frequency spectrum can therefore be fully eliminated only if in each sequence the nuclear magnetization were subjected to the same disturbing influence until the sample value is recorded.

If therefore the widening of the lines is determined by the so-called T2 relaxation, which starts after the first high-frequency pulse of a sequence, the sample values over which the Fourier transformation is carried out must all have the same distance from the first high-frequency pulse of their sequence. If on the contrary the widening of the lines is caused by eddy current effects, the sample value must each time have the same distance from the gradient fields which produce the eddy currents. Since because of the decay of the eddy current effects the influence of a magnetic gradient field is larger as its distance from the echo signal is smaller, the sample values subjected to the Fourier transformation would have to be at the same distance from the last high-frequency pulse—in case the magnetic gradient fields are in a fixed time relationship to this last high-frequency pulse.

In general, it is therefore not possible to eliminate at the same time the influence of the T2 relaxation and that of the eddy currents on the line width. However, the sample values can be chosen so that the influence is reduced.

It should be noted here that a method of determining the spectrum of molecules in the dissolved state is already known, in which also a number of sequences is used in which the position in time of the echo signal varies from sequence to sequence (cf. J. Chem. Phys. Vol. 64, Nr. 10, May 15, 1976, pp. 4226 and 4227). The sample values of the individual echo signals are then subjected to a bidimensional Fourier transformation. The molecules then to be examined consist of different groups, for example methyl, methylene and hydroxyl groups, whose protons are subjected on the one hand to a chemical shift and on the other hand have a multiplet structure because of resonance-resonance interactions. This would have the result that in a unidimensional frequency spectrum a large number of lines would be contained, which are distributed by the bidimensional Fourier transformation in a bidimensional spectrum, the spectrum showing in the direction of one frequency axis the resonance frequencies not influenced by the interaction and showing in the direction of the other frequency axis solely the multiplet division.

It is not important for the invention what kind of echo signals is used. It is only essential that the position in time of the echo signal can be varied within a sequence by varying the position in time of the high-frequency pulses. Preferably, stimulated echo signals are processed, but other echo signals, for example stimulated resonance echo signals, may also be evaluated.

Figure 4:
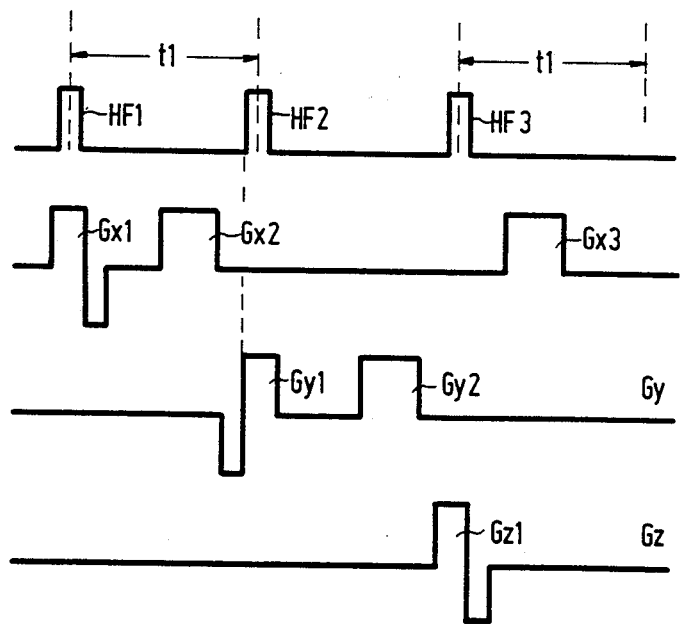
Figure 2:
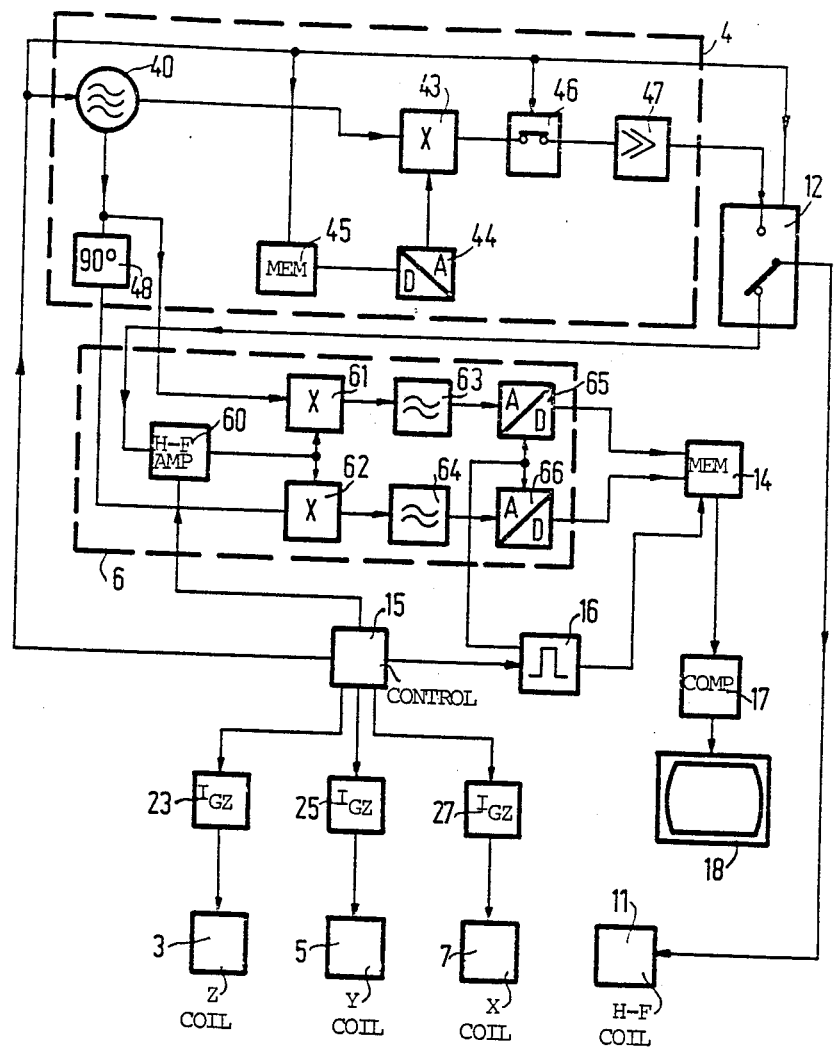
Figure 3:
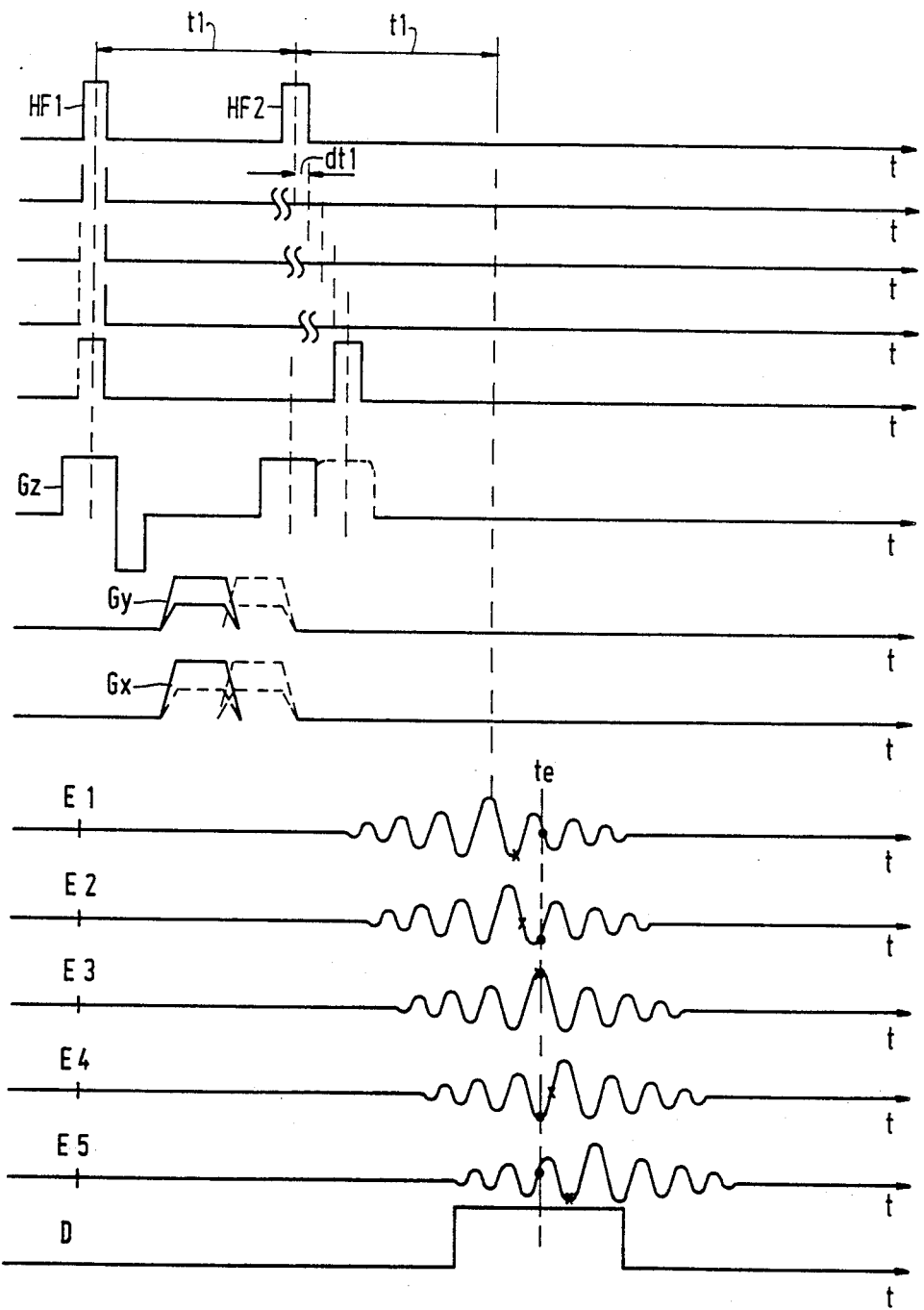

In order that the invention may be readily carried out, it will now be described more fully with reference to the accompanying drawing, in which:

FIG. 1 shows an apparatus for medical nuclear magnetic resonance examinations, by means of which the method according to the invention can be carried out, FIG. 2 shows a block circuit diagram of such an apparatus, FIG. 3 shows the variation with time of different signals in a method according to the invention, and FIG. 4 shows the variation with time of part of these signals in a preferred method.

The nuclear magnetic resonance examination apparatus shown in FIG. 1 comprises an arrangement consisting of four coils 1 for producing a homogeneous stationary magnetic field, which can be of the order of a few tenths of a T (Tesla) to a few T. This field extends in the z direction of a Cartesian coordinate system. The coils 1 arranged concentrically to the z axis can be arranged on a spherical surface 2. The patient 20 to be examined is situated within these coils.

Four coils 3 are preferably arranged on the same spherical surface for producing a magnetic field extending in the z direction and varying linearly in this direction. Further, four coils 7 are provided, which produce a magnetic gradient field Gx also extending in the z direction (that is to say a magnetic field, whose strength varies linearly in one direction), whose gradient extends in the x direction, however. A magnetic gradient field Gy extending in the z direction and having a gradient in the y direction is produced by four coils 5, which may have the same shape as the coils 7, but which are offset by 90° with respect to the latter coils. Only two of these four coils are shown in FIG. 1.

Since each of the three coil arrangements 3, 5 and 7 for producing the magnetic gradient field Gz, Gy and Gx is arranged symmetrically to the spherical surface 2, the field strength at the centre of the sphere, which constitutes at the same time the coordinate origin of the aforementioned Cartesian xyz coordinate system, is determined only by the stationary homogeneous magnetic field of the coil arrangement 1. Furthermore, a high-frequency coil 11 is arranged symmetrically to the plane $z=0$ of the coordinate system, which is formed so that a high-frequency magnetic field is produced thereby which is substantially homogeneous and extends in the z direction, i.e. at right angles to the direction of the stationary homogeneous magnetic field. A high-frequency modulated current is supplied by a high-frequency generator to the high-frequency coil during each high-frequency pulse. After the occurrence of three high-frequency pulses the high-frequency coil 11 serves to receive the echo signal produced at the examination area. Instead, however, a separate high-frequency reception coil may also be used.

FIG. 2 shows a simplified block circuit diagram of this nuclear magnetic resonance examination apparatus. The high-frequency coil 11 is connected through a change-over device 12 on the one hand to a high-frequency generator 4 and on the other hand to a high-frequency receiver 6.

The high-frequency generator 4 comprises a high-frequency oscillator 40, whose frequency can be digitally controlled and which supplies oscillations having a frequency equal to the Larmor frequency of the atom cores to be excited at the field strength produced by the coils 1. The Larmor frequency f can be calculated, as is known, according to the relation $f=cB$, where B is the magnetic induction in the stationary homogeneous magnetic field and c is the gyro-magnetic ratio, which is, for example, for protons 42.56 MHz/T. The output of the oscillator 40 is connected to an input of a mixer stage 43. A second input signal is supplied to the mixer stage 43 by a digital-to-analogue converter 44, whose output is connected to a digital memory 45. Under the control of a control device 15, a sequence of digital data words representing an envelope signal is read out from the memory.

The mixer stage 43 processes the input signals supplied to it in such a manner that the carrier oscillation modulated by the envelope signal appears at its output. The output signal of the mixer stage 43 is supplied through a switch 46 controlled by the control device 15 to a high-frequency power amplifier 47, whose output is connected to the change-over device 12. The latter is also controlled by the control device 15.

The receiver 6 comprises a high-frequency amplifier 60, which is connected to the change-over device and to which the stimulated echo signal induced in the high-frequency coil 11 is supplied, in which event the change-over device must have the corresponding switching state. The amplifier 60 has a muting circuit input which is controlled by the control device 15 and through which it can be cut off so that the amplification is substantially zero. The output of the amplifier is connected to the first inputs of two multiplicative mixer stages 61 and 62, which each time supply an output signal corresponding to the product of their input signals. A signal having the frequency of the oscillator 40 is supplied to the second inputs of the mixer stages 61 and 62, a phase shift of 90° existing between the signals at the two inputs. This phase shift is produced by means of a 90° phase shift member 48, whose output is connected to the input of the mixer stage 62 and whose input is connected to the input of the mixer stage 61 and to the output of the oscillator 40.

The output signals of the mixer stages 61 and 62 are supplied through low-pass filters 63 and 64, which suppress the frequency supplied by the oscillator 40 and all the frequencies lying above it and which each pass low-frequency components, to an analogue-to-digital converter 65 and 66, respectively. The latter converts the analogue signals of the circuit 61...64 constituting a quadrature demodulator into digital data words, which are supplied to a memory 14. The analogue-to-digital converters 65 and 66 as well as the memory 14 receive their clock pulses from a clock pulse generator 16, which can be blocked and activated, respectively, by the control device 15 through a control lead so that only in a measuring interval defined by the control device 15 the signals supplied by the high-frequency coil 11 and transposed to the low-frequency range can be converted into a sequence of digital data words and can be stored in the memory 14.

The three coil arrangements 3, 5 and 7 are each time supplied by current generators 23, 25 and 27 with a current whose variation with time can be controlled by the control unit 15. The data words or sample values stored in the memory 14 are supplied to a computer 17, which determine therefrom by a discrete Fourier transformation the spectral distribution of the nuclear magnetization and delivers it at a suitable reproducing unit, for example a monitor 18.

FIG. 3 shows the variation with time of different signals received or produced with the circuit of FIG. 2 for the method according to the invention. The first line shows the variation with time of the output signal of the high-frequency generator 4 at a first frequency. First a first high-frequency pulse HF1, preferably a 90° high-frequency pulse, is produced and then a second high-frequency pulse HF2, i.e. a 180° pulse, is produced at a distance in time t1 from the first high-frequency pulse. As a result, an echo signal E1 is produced, whose variation with time is represented on the ninth line. The distance in time of the centre of this high-frequency signal from the centre of the second high-frequency pulse HF2 is equal to the distance in time t1 between the centres of the first and the second high-frequency pulse.

The second sequence, which is indicated only diagrammatically on the second line, is distinguished from the first sequence in that the distance in time between the high-frequency pulses HF1 and HF2 is increased by the amount dt1. Consequently, the distance of the echo signal E2 produced by these high-frequency pulses and represented on the tenth line from the second high-frequency pulse also increases by the amount dt1 and from the first high-frequency pulse by the amount 2dt1. The third sequence is distinguished from the second sequence in that the distance between the two high-frequency pulses (third line) is increased again by dt1, so that the distance of the echo signal from the first and from the second high-frequency pulse is increased again by dt1 and 2dt1, respectively. The same applies to the high-frequency pulses (fourth line) and the echo signal E4 (twelfth line) of the fourth sequence with a view to the corresponding signals in the third sequence and to the fifth sequence with a view to the fourth sequence. With the fifth sequence the distance between the two high-frequency pulses (cf. line 5 of FIG. 3) is therefore by 4dt1 larger than t1 and the distance in time between the echo signal E5 produced therefrom (cf. the thirteenth line of FIG. 3) from the first and the second high-frequency pulses is by 8dt1 and 4dt1, respectively, larger than the corresponding distance in the first sequence.

In practice, not only five sequences with a distance between the high-frequency pulses preferably uniformly varied from sequence to sequence, but n sequences are carried out, where n is, for example, 32, 64 or 128.

Each of the echo signals produced with the different sequences is sampled during a time interval having a defined length and a defined distance from the first high-frequency pulse; in this time interval the clock generator 16 is made operative by the control signal D (FIG. 3, last line) of the control unit 15 so that each time the output signals of the low-pass filters 63 and 64 are converted only in these time intervals by the analogue-to-digital converters 65 and 66 into digital sample values and are stored in the memory 14. The time intervals in which the echo signals are each time sampled must not necessarily have the same duration and the same distance from the first high-frequency pulse. It is sufficient when they overlap each other in at least one time period. The computer 17 is programmed so that it subjects the sample values recorded at the time t=te, i.e. at each time the same distance from the first high-frequency pulse, to a Fourier transformation. Therefore, not the sequence of the sample values of a single echo signal, but those sample values of different echo signals at which the disturbing influence (in the case described thus far the decay of the transverse magnetization) each time during the same time interval was operative within the frequency, are subjected to a Fourier transformation. It can be shown that the frequency spectrum obtained by such a Fourier transformation corresponds to the frequency spectrum which would be obtained if the disturbing influence should not be present, each component of the spectrum being multiplied, however, by a factor which depends inter alia upon te. Consequently, the disturbing influence does not become manifest as a widening of the lines of the spectral components obtained.

If not the sample value of the individual echo signals occurring at the instant t = te, but a sample value occurring at another instant, should be subjected to a Fourier transformation, in the ideal case the same frequency spectrum would have to be obtained. Because of inevitable errors in recording the measuring values and processing them, however, deviations are obtained which can be reduced in that several sequences of sample values are subjected to the Fourier transformation, each sequence comprising only such sample values which have the same distance in time from the first high-frequency pulse and that the frequency spectra obtained in this manner and only slightly deviating from each other are added together.

It was assumed above that the widening of the lines is due only to the decay of the nuclear magnetization. However, the eddy currents produced when magnetic gradient fields are switched on and off may also become manifest in a widening of the spectral lines—in practice mostly even more strongly than the decay of the transverse magnetization. If this disturbing influence should be eliminated, those sample values should be used for the Fourier transformation upon whose recording the examination area was subjected to the influence of the eddy currents for at least an approximately equally long time.

The variation with time of the magnetic gradient fields Gz, Gy and Gx generated by the coil arrangements 3, 5 and 7 and producing the eddy currents is indicated on lines six, seven and eight. During the first high-frequency pulse, the magnetic gradient field Gz is switched on, whose polarity is reversed after the termination of the high-frequency pulse, so that the time integral becomes zero from the centre of the high-frequency pulse to the instant of switching off the gradient field Gz. As a result, the nuclear magnetization is solely excited in a layer at right angles to the z axis. During the second high-frequency pulse, the magnetic gradient field Gz is switched on again, i.e. during a time period which is symmetrical to this high-frequency pulse and which is displaced from sequence to sequence with the high-frequency pulse, as is indicated on the sixth line of FIG. 3 by full lines (for the first sequence) and broken lines (for the fifth sequence). Between the instants of switching-on the magnetic gradient field Gz for the first and for the second time, the gradient fields Gy and Gx are also switched on during a defined time interval i,e. so that the distance from the second high-frequency pulse each time remains constant, which is indicated on the lines seven and eight in FIG. 3 by the full lines and the broken lines, respectively. The gradient field Gz is switched therefore for the first time in a fixed time relationship with the first high-frequency pulse, while the gradient field Gz is switched for the second time and the gradient fields Gy and Gx are switched in a fixed time relationship with the second high-frequency pulse.

The sample values indicated by a cross of the different echo signals E1 . . . E5, which are each time at the same distance from the second high-frequency pulse HF2 (whose distance from the first high-frequency pulse increases by dt1 from sequence to sequence) are used for the Fourier transformation. In this position of the sampling instants, the eddy currents, which are produced when the magnetic gradient field symmetrical to the second high-frequency pulse and the gradient fields Gy and Gx are switched, act within the sequence for an equally long time so that they cannot lead to a widening of the lines of the frequency spectrum obtained by the Fourier transformation. Though this does not apply to the eddy currents occurring when the gradient field Gz is switched for the first time in a fixed time relationship with the first high-frequency pulse, their influence remains small because of the exponential decay and the comparatively large distance in time from the echo signal. Also in this case it is possible, as described above, to repeat the Fourier transformation over further sequences of sample values and to sum up the results.

It appears from the foregoing that with the indicated resonance echo sequence it is not possible to produce a Fourier spectrum, which is freed at the same time from the disturbing influences of the eddy currents and of the decay of the transverse magnetization. However, it is possible to reduce the effect of these two disturbing influences on the line width in that sample values are used which have been recorded between the instant te and the sampling instants indicated by a cross.

With the method described in FIG. 3, the spectral distribution in the volume elements of a layer can be recorded. For this purpose, as already described, first n sequences are carried out, the distance between the high-frequency pulses being varied from sequence to sequence. This method is then repeated p times, the gradient Gy being varied each time by a small amount. This is all repeated again m times, the gradient Gx being varied each time by a small amount. The quantity of data then obtained is subjected to a triple discrete Fourier transformation, a frequency spectrum being obtained each time for m,p volume elements in the layer.

It will be appreciated that such a method is extraordinarily time-consuming. In general, for diagnostic purposes only the knowledge of the spectral distribution in one or a few limited volume elements is required.

FIG. 4 shows a sequence which is particularly suitable to determine the spectral distribution of the nuclear magnetization in a limited volume range. Each sequence comprises three high-frequency pulses, which are preferably 90° high-frequency pulses. During the first high-frequency pulse, a magnetic gradient field Gx1 having a gradient in the x direction is switched on, while during the second high-frequency pulse a magnetic gradient field Gy1 having a gradient in the y direction is switched on and during the third high-frequency pulse a gradient field Gz1 having a gradient in the z direction is switched on. The variation with time of the magnetic gradient fields Gx1 and Gz1 is chosen so that the gradient is constant during the associated high-frequency pulse and then is reversed in direction and is subsequently switched off so that the integral across the gradients from the centre of the high-frequency pulse HF1 and HF3, respectively, is zero until the gradient field Gx1 and Gy1, respectively, is switched off.

If the layer excitation by the second high frequency pulse HF2 should take place in the same manner as with the first and the third high-frequency pulse HF1 and HF3, respectively, in that consequently during the high-frequency pulse the gradient field Gy extending in the y direction would be switched on and would then be changedover, the nuclear magnetization in the sectional area of the layers excited by the three high-frequency pulses would partly be shifted in phase. This would result in that upon the reception of the nuclear magnetic resonance signal originating from this area a deteriorated signal-to-noise ratio would be obtained. This deterioration is avoided in that, as appears from FIG. 4, before the second high-frequency pulse HF2 the magnetic gradient field Gy1 is switched on, as a result of which the nuclear magnetization in the layer excited by the first high-frequency pulse and at right angles to the x axis is shifted in phase in the y direction. Due to the fact that the polarity of this gradient field is changed over so that this gradient field has during the second high-frequency pulse a polarity opposite to that immediately before and due to the fact that the variation with time of the magnetic gradient field is chosen so that the time integral across this field is zero from the switching-on instant to the centre of the second high-frequency pulse, this phase shift is eliminated to a great extent, however. In fact it has been found that the first and the third high-frequency pulse trigger the vector of the nuclear magnetization from the longitudinal, i.e. the z direction to the transversal direction (i.e. in the xy plane), while the second pulse triggers in a mirror image position with respect thereto the nuclear magnetization from the transversal direction to the longitudinal direction. Therefore, the second pulse with the accompanying magnetic gradient field must be in time the mirror image of the first and the third high-frequency pulse, respectively, with the each time accompanying magnetic gradient field, with respect to the centre of the pulses. This is ensured by the variation with time shown in FIG. 2.

The nuclear magnetization is excited in three layers at right angles to each other by the three high-frequency pulses in association with the gradient fields. The thickness of these layers depends upon the band width of the high-frequency pulses, which in turn is determined by the envelope signal stored in the memory 45, and upon the value of the gradient of the gradient fields Gx1, Gy1 and Gz1, respectively.

In the sectional area of these three layers, inter alia a stimulated echo signal is produced. All the remaining nuclear magnetic resonance signals which are obtained in this area—or outside it—are suppressed by gradient fields Gx2, Gx3 as well as Gy2. The gradient field Gx2, which is switched on in time between the gradient fields Gx1 and Gy1, and the gradient field Gx3, which is switched on after the gradient field Gz1 and before the sampling of the echo signal, have such a variation with time that the time integral over the gradients is equal in both cases and has such a value that the nuclear magnetization in the layer at right angles to the x axis would be shifted in phase if only one of the gradient fields should be active. The magnetic gradient field Gy2, whose gradient extends at right angles to the gradients of the gradient fields Gx2 and Gx3, respectively, is disposed in time between the gradient fields Gy1 and Gz1. The time integral thereover corresponds to the corresponding integral value over the fields Gx2 and Gx3, respectively.

The distance in time of the stimulated echo signal produced by the sequence shown in FIG. 4 from the third high-frequency pulse corresponds to the distance in time t1 between the first and the second high-frequency pulse. The position of the stimulated echo signal may consequently be varied, for example, in that the position of the second high-frequency pulse with respect to the first or the third high-frequency pulse is varied. If the distance of the magnetic gradient fields Gx2 and Gy2 from the first and from the third high-frequency pulse, respectively, is maintained, the sample values of the stimulated echo signal, which are each time recorded at the same distance from the first and the third high-frequency pulses HF1 and HF3, respectively, have also the same distance in time from the magnetic gradient fields Gx1, Gx2, Gx3, Gy2 and Gz1. Consequently, the eddy currents of the said gradient fields and the decay of the transverse magnetization are active for each sample value for an equally long time. They therefore do not lead to a widening of the lines. Therefore, only the eddy currents of the magnetic gradient field Gy1 coupled in time with the second high-frequency pulse HF2 may lead to a widening of the line.

With the sequence shown in FIG. 4, however, it is also possible that the distance between the second and the third high-frequency pulse is kept constant and only their distance from the first high-frequency pulse is varied. If the magnetic gradient fields Gx2, Gy2 and Gx3 retain their position in time with respect to the second and the third high-frequency pulse with all sequences, the eddy currents produced when these magnetic gradient fields and the gradient fields Gy1 and Gz1 are switched do not influence the spectrum determined by Fourier transformation if the Fourier transformation is always based on sample values which have the same distance in time from the second and the third high-frequency pulse, respectively. In this case, only the decay of the transverse magnetization and the decay of the transverse magnetization and the eddy currents connected with the magnetic gradient field Gx1 can have a disturbing influence, but their influence on the frequency spectrum is smaller than in the case mentioned before, because the distance in time between the stimulated echo signal and Gx1 is larger than the distance of this echo signal from Gy1. The influence of the eddy currents on the width of the resonance lines of the spectrum is thus reduced to an even greater extent, which is the reason why this method is of particular advantage if the influence of the eddy currents connected with the second and the third high-frequency pulse on the widening of the lines is comparatively large.

What is claimed is:

1. A method for determining the spectral distribution of the nuclear magnetization in a limited volume range comprising the steps of repetitively producing sequences comprising at least two high-frequency pulses acting upon an examination area in the presence of a stationary homogeneous magnetic field, converting an echo signal produced in the volume range into digital sample values, and thereafter performing a Fourier transformation of the sample values wherein the position in time within the sequence of at least one high-frequency pulse is varied from sequence to sequence so that the position in time of the echo signal is displaced within successive sequences and, from each of these sequences, a sample value having a given position in time within the sequence is used for the Fourier transformation.

2. A method as claimed in claim 1, wherein each sequence comprises, for producing a resonance echo signal, a first 90° high-frequency pulse, and then a 180° high-frequency pulse.

3. A method as claimed in claim 1, wherein each sequence comprises, for producing a stimulated echo signal, three 90° high-frequency pulses.

4. A method as claimed in claim 3 wherein a magnetic gradient field is provided during each of said pulses and the polarity of the magnetic gradient field active during the first and the third high-frequency pulses is changed over after the first high-frequency pulse and the third high-frequency pulse, respectively, a magnetic gradient field having an opposite polarity is switched on by the second high-frequency pulse, and the variation with time of each of the gradient fields active during a high-frequency pulse is chosen so that the time integral is zero from the center of the first and the third high-frequency pulses, respectively, to the instant of switching-off the respective gradient field and from the switching-on instant of the gradient field to the center of the second high-frequency pulse.

5. A method as claimed in claim 3 or 4, wherein in the different sequences the first and the third high-frequency pulses have the same distance in time from each other and in that the position in time of the second high-frequency pulse with respect to the first and the third high-frequency pulses, respectively, is varied from sequence to sequence.

6. A method as claimed in any one of claims 1 to 3, wherein the sample values from different sequences are subjected to a Fourier transformation, which sample values have the same distance in time from the first high-frequency pulse of the sequence.

7. A method as claimed in claim 2, wherein all sequences, magnetic gradient fields are switched on and off, respectively, in a fixed time relationship with the 180° pulse, and wherein each time those sample values from different sequences are subjected to a Fourier transformation at a fixed time from the 180° high-frequency pulse.

8. A method as claimed in claim 3, wherein in all sequences the second and the third high-frequency pulses have the same distance in time from each other, their distance from the first high-frequency pulse is varied from sequence to sequence, and magnetic gradient fields except one magnetic gradient field associated with the first high-frequency pulse, have in all sequences the same position in time with respect to the second and third high-frequency pulses and those sample values from the different sequences are subject to a Fourier transformation at a fixed time from the second and the third high-frequency pulses, respectively.

9. A method as claimed in any one of claims 1-4, 7 or 8 characterized in that several sequences of sample values are subjected to a Fourier transformation, the sample values of a sequence each time having the same distance in time from one of the high-frequency pulses of the respective sequence, and in that the spectral distributions resulting therefrom are added together.

10. An arrangement for carrying out the method claimed in claim 1 comprising a magnet for producing a homogeneous stationary magnetic field, a high-frequency coil arrangement for producing a high-frequency magnetic field at right angles to the stationary magnetic field, a high-frequency generator for feeding the high-frequency coil arrangement, a control unit for controlling the high-frequency generator and a computer for processing nuclear magnetic resonance signals, characterized in that the control unit is constructed so that in each sequence at least two high-frequency pulses are produced, whose distance varies from sequence to sequence, and in that the computer is constructed so that it carries out a Fourier transformation with sample values of the echo signals from successive sequences.

* * * * *